United States Patent
Hamers et al.

(10) Patent No.: US 7,160,809 B2
(45) Date of Patent: Jan. 9, 2007

(54) PROCESS AND DEVICE FOR THE DEPOSITION OF AN AT LEAST PARTIALLY CRYSTALLINE SILICIUM LAYER ON A SUBSTRATE

(75) Inventors: Edward Aloys Gerard Hamers, Eindhoven (NL); Arno Hendrikus Marie Smets, Maasbree (NL); Mauritius Cornelius Maria Van De Sanden, Tilburg (NL); Daniel Cornelis Schram, Eindhoven (NL)

(73) Assignee: Technische Universiteit, Eindhoven (NL)

( * ) Notice: Subject to any disclaimer, the term of this patent is extended or adjusted under 35 U.S.C. 154(b) by 143 days.

(21) Appl. No.: 10/473,222

(22) PCT Filed: Apr. 12, 2002

(86) PCT No.: PCT/NL02/00244

§ 371 (c)(1),
(2), (4) Date: Sep. 29, 2003

(87) PCT Pub. No.: WO02/083979

PCT Pub. Date: Oct. 24, 2002

(65) Prior Publication Data

US 2004/0097056 A1    May 20, 2004

(30) Foreign Application Priority Data

Apr. 16, 2001  (NL) .................................. 1017849

(51) Int. Cl.
*H01L 21/311* (2006.01)
*H01L 21/31* (2006.01)

(52) U.S. Cl. ................ 438/695; 118/716; 257/E21.001

(58) Field of Classification Search ................ 438/758, 438/759, 788, 689, 694, 695; 118/715, 719, 118/720, 723 FE, 723 FI, 723 ME, 723 ER, 118/723 IR, 716

See application file for complete search history.

(56) References Cited

U.S. PATENT DOCUMENTS

| 5,591,492 A | 1/1997 | Hirai et al. |
| 6,017,779 A * | 1/2000 | Miyasaka ................... 438/149 |
| 6,152,071 A * | 11/2000 | Akiyama et al. ..... 118/723 VE |

FOREIGN PATENT DOCUMENTS

| EP | 0 297 637 | 1/1989 |
| WO | WO 00/74932 | 12/2000 |

OTHER PUBLICATIONS

Wilbers A T M et al: "Amorphous Hydrogenated Silicon Films Produced by an Expanding Argon-Silane Plasma Investigated with Spectroscopic IR Ellipsometry" Thin Solid Films, Elsevier-Sequoia S.A. Lausanne, CH, vol. 204, No. 1, Sep. 20, 1991, pp. 59-75, XP000275034.

(Continued)

*Primary Examiner*—Brook Kebede
(74) *Attorney, Agent, or Firm*—Young & Thompson

(57) ABSTRACT

In a process and device for depositing an at least partially crystalline silicon layer a plasma is generated and a substrate (24) is exposed under the influence of the plasma to a silicon-containing source fluid for deposition of silicon therefrom. A pressure drop is applied between a location (12) where the source fluid is supplied and the substrate (24). In addition to the source fluid an auxiliary fluid is also injected which is able to etch non-crystalline silicon atoms. The substrate (24) is exposed to both the source fluid and the auxiliary fluid.

22 Claims, 2 Drawing Sheets

OTHER PUBLICATIONS

Severens R J et al: "An Expanding Thermal Plasma for Deposition of A-SI:H" Amorphous Silicon Technology 1995. San Francisco, Apr. 18-21, 1995, MRS Symposium Proceedings, Pittsburgh, MRS, US, vol. 377, Apr. 18, 1995, pp. 33-38, XP000656314.

Patent Abstracts of Japan, vol. 010, No. 049, Feb. 26, 1986 & JP 60 194065 A, Oct. 2, 1985, abstract.
Patent Abstracts of Japan, vol. 010, No. 125, May 10, 1986 & JP 60 257130 A, Dec. 18, 1985, abstract.

* cited by examiner

PROCESS AND DEVICE FOR THE DEPOSITION OF AN AT LEAST PARTIALLY CRYSTALLINE SILICIUM LAYER ON A SUBSTRATE

BACKGROUND OF THE INVENTION

1. Field of the Invention

The present invention relates to a process for depositing an at least partially crystalline silicon layer on a substrate using a plasma, wherein a plasma is generated and the substrate is exposed to a silicon-containing source fluid for deposition of silicon therefrom. The invention also relates to a device for depositing an at least partially crystalline semiconductor layer on a substrate, comprising a plasma chamber for generating a plasma therein, a reaction chamber provided with a substrate holder which is in open communication with the plasma chamber via a passage opening, and supply means for a source fluid.

Such a process and device find particular application in the modern semiconductor industry and solar cell industry, and then mainly for the manufacture of thin-film solar cells and thin-film transistors (TFT) and diodes, these latter being applied particularly for driving of image reproducing systems on the basis of liquid crystal cells and other solid-state elements. These semiconductor elements are generally formed in a thin silicon layer, wherein the silicon layer itself lies on an underlying substrate. In view of the explosive growth in the demand for such image reproducing systems and the expectation that the demand for solar cells as alternative energy source will also greatly increase in the near future, a process of the type stated in the preamble, with which a high-quality silicon layer can be formed in economic manner, is of exceptionally great importance.

2. Description of the Related Art

Different processes of forming a silicon layer on an underlying substrate are per se known. These processes consist on the one hand of deposition techniques wherein a silicon layer can be deposited from a chemical vapour of a silicon-containing source fluid. Such processes are designated CVD (Chemical Vapour Deposition), frequently with the addition of "RF Plasma Enhanced" or "Hot Wire" to indicate that a radio-frequency plasma or a hot wire, usually of tungsten, is used to support the process. The morphology of the deposited layer herein varies from strictly amorphous to microcrystalline and polycrystalline. In addition, there are epitaxial growing techniques wherein a silicon layer is thickened epitaxially after a seed layer has first been formed using for instance a laser technology.

A drawback to these known techniques is however the relatively low growth speed of often no more than only a few tenths of a nanometre per second and, in the case of epitaxial growth, the relatively high temperature to which the substrate has to be exposed to obtain a high-quality crystalline silicon layer. These techniques are therefore less suitable for large-scale industrial application, and significant demands are also made in respect of the heat resistance of the substrate. For this reason these known methods particularly do not lend themselves for a new development in the field of solar cells, wherein these are applied in a silicon layer of typically 1 μm thickness on a foil of a plastic usually having little heat resistance. The efficiency of these existing techniques, in which a usually relatively expensive source fluid is used, is moreover comparatively low where they are used.

BRIEF DESCRIPTION OF THE DRAWINGS

It is one of the objects of the present invention to provide a process and device of the type stated in the preamble with which, even at a relatively low temperature, a high-quality crystalline silicon layer can be formed with a markedly higher growth speed than has heretofore been achievable with the known techniques.

In order to achieve the intended objective, a process of the type stated in the preamble has the feature according to the invention that the substrate is moreover exposed to an auxiliary fluid which is preferably able to etch non-crystalline bonded silicon atoms, and that a pressure drop is applied in a path of both fluids to the substrate. In order to achieve the stated objective a device of the type mentioned in the preamble accordingly has the feature according to the invention that the plasma chamber is provided with supply means for an auxiliary fluid for guiding this latter together with the source fluid to the substrate, and that pump means are provided for applying a pressure drop between the plasma chamber and the substrate holder at least during operation. It is noted here that where mention is made in the context of the present invention of an exposure of the substrate to a fluid, this is understood to mean in fact only an exposure to reaction components which are formed in or by a plasma from the fluid.

Figure 1:
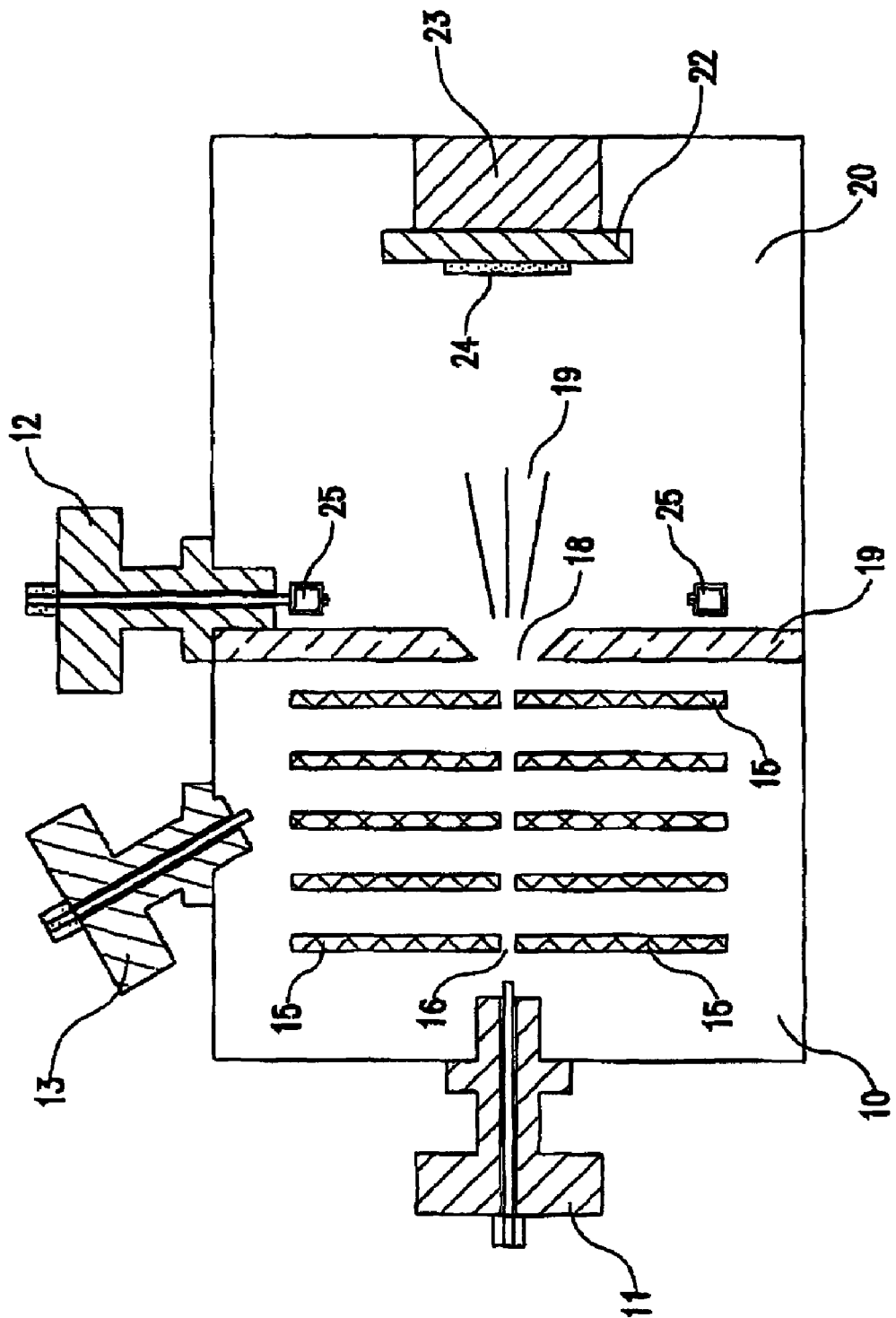

The pressure drop applied according to the invention results in a flow of both fluids to the substrate, whereby this latter is exposed to a markedly greater flux than is the case in the stated known processes. Higher growth speeds can accordingly be hereby achieved. The auxiliary fluid here ensures that deposited silicon atoms not bonded in a crystal lattice are etched away so that the final layer is of at least substantially crystalline nature. The invention is herein based on the insight that silicon atoms in the crystal lattice are in a more favourable energetic state than non-bonded, amorphous silicon atoms, so that these latter can be selectively removed with a suitable auxiliary fluid of the indicated type. The thus removed silicon atoms are then once again at least partially available for nestling in the crystal lattice, which enhances the final efficiency. Owing to this combined deposition and selective etching a high-quality microcrystalline silicon layer can be deposited even at a relatively low substrate temperature. This relates to material in which crystallites are present of typically 10–100 nm. These crystallites are optionally surrounded by an amorphous matrix. The material hereby combines a number of properties of monocrystalline and amorphous silicon. Due to the crystal structure that is present the electrical conductivity is thus significantly better than that of amorphous silicon, which is important for the electrical characteristics of semiconductor elements to be formed therein. The temperature at which the material is manufactured is on the other hand significantly lower than the melting temperature of silicon required for the production of monocrystalline material. The invention can hereby also be used for deposition on substrates which do not tolerate such a high temperature, such as the majority of plastics.

A particular embodiment of the process according to the invention has the feature that the auxiliary fluid is chosen from a group comprising compounds containing hydrogen, chlorine and fluorine. Hydrogen, chlorine and fluorine in a plasma are found to be able to selectively remove silicon atoms not bonded in a crystal lattice. A particular embodiment of the process herein has the feature according to the invention that hydrogen gas is applied for the auxiliary fluid.

Hydrogen gas is recommended because it is considerably less aggressive than for instance fluorine and, other than fluorine, does not damage metal parts of a reactor in which the process is carried out.

A further particular embodiment of the process according to the invention has the feature that a compound from a group of silane ($SiH_4$), disilane ($Si_2H_6$) and silicon tetrafluoride ($SiF_4$) is applied for the source fluid. These silicon-containing compounds are found to be an extremely good source of silicon atoms, particularly in the state excited by the plasma.

In a further particular embodiment the process according to the invention is characterized in that an at least substantially inert carrier fluid is also injected and guided to the substrate. With the injection of an inert carrier fluid a relatively large flux can be created in which both reaction fluids are entrained. These reactants hereby have less opportunity to enter into a reaction with parts of the reactor, which therefore becomes contaminated to a lesser extent. A further embodiment of the process is characterized herein in that the carrier fluid is chosen from a group of noble gases, and more particularly in that argon is applied for the carrier fluid. The reaction is continuously flushed by the injection of such an inert noble gas in order to limit contamination to a minimum.

In many cases the deposited silicon layer will eventually have to have specific semiconducting and/or optical properties. With a view hereto, a further particular embodiment of the process according to the invention has the feature that a doping fluid is injected containing an element chosen from group III and V of the periodic system, in particular boron, phosphor, arsenic or antimony. These elements are able to change the (semi)conducting properties of the formed silicon layer and can be used to create an internal electrical field therein. This is particularly important for the manufacture of solar cells and other semiconducter elements in or from the deposited silicon layer. With a view to manufacturing solar cells in particular, a further embodiment of the process according to the invention has the feature that a doping fluid is injected containing carbon. This is because carbon provides an increased light absorption in the final silicon layer, which enhances the efficiency of for instance a solar cell.

A further particular embodiment of the process has the feature according to the invention that the carrier fluid and the auxiliary fluid are both injected at the location of the plasma and that the source fluid is supplied in a path of the carrier fluid and the auxiliary fluid to the substrate. Both the auxiliary fluid and the carrier fluid are herein introduced into the plasma arc and then carried along in a path to the substrate. The usually aggressive and highly reactive source fluid is only admixed into this path later and therefore has virtually no chance of adversely affecting the plasma chamber.

A further particular embodiment of the process according to the invention has the feature that the auxiliary fluid is supplied in at least almost the same quantity as the source fluid. An almost equal quantity of source fluid and auxiliary fluid is found in practice to be sufficient to obtain the desired morphology of the semiconductor material at a substrate temperature of about 500° C. However, a further preferred embodiment of the process according to the invention has the feature that the auxiliary fluid is supplied in a considerably larger quantity than the source fluid. By supplying the auxiliary fluid in an excess quantity of typically between ten and a thousand times the amount of source fluid, in particular twenty to one hundred times more, a crystalline structure is obtained which is if possible of even higher quality, wherein the substrate temperature can remain limited in practice to the order of no more than about 250° C. The process can thereby be applied to a wide variety of substrates.

In a practical embodiment the process according to the invention is characterized in that the substrate is herein accommodated in a reaction chamber, that a plasma arc is generated in a plasma chamber, that an underpressure is created in the reaction chamber relative to the plasma chamber, and that the plasma chamber and reaction chamber are in open communication with each other via a passage opening. Such an arrangement is described in a European patent application number 297.637 of applicant, the content of which should be deemed as cited and interpolated herein. It is thus found possible in practice to form a silicon layer of a good quality with a growing speed in the order of several nanometres per second.

A further embodiment of the process has in this respect the feature that at least the auxiliary fluid is injected into the plasma chamber and that the source fluid is supplied all around the passage opening in the reaction chamber. By thus injecting the source fluid wholly or in large part around the passage opening an exceptionally homogeneous mixture is obtained and a high dosage and a resulting correspondingly high growth speed can be obtained.

The auxiliary fluid and the carrier fluid can per se both be injected in the same plasma chamber and then carried to the substrate. However, a further preferred embodiment of the process according to the invention has the feature that the reaction chamber is placed via a further passage opening in open communication with a further plasma chamber in which a further plasma arc is generated, and that at least the auxiliary fluid is injected into the first plasma chamber and one or more fluids of a differing composition are fed into the further plasma chamber Different mixtures of the different fluids can thus be applied in the separate plasma chambers in order to optimize the process. The plasma conditions in the plasma chamber in which the injection of the carrier fluid takes place can be optimized as such for the purpose of the thereby intended dissociation of the source fluid, while the first plasma chamber can be optimally adjusted wholly independently with a view to the intended selective etching action of the auxiliary fluid on the formed layer. This latter plasma chamber can moreover be placed at a smaller or, on the contrary, greater distance from the substrate so as to reduce or increase the number of gas phase interactions of the auxiliary fluid before it reaches the substrate. A particular embodiment of the device according to the invention has the feature in this respect that the first plasma chamber provided with the supply means for the auxiliary fluid is placed closer to the substrate holder than the further plasma chamber. The loss of atomic auxiliary fluid, in particular hydrogen, as a consequence of unintended transverse diffusion can thus be limited.

Although the pressure drop results in itself in an exceptionally directional process, a further embodiment of the process according to the invention has the feature that a bias voltage is applied between the substrate and the plasma so as to further enhance the directional behaviour of charged particles. The greater flux of reaction particles resulting herefrom leads to a denser structure in the formed layer, which is desirable in some cases.

BRIEF SUMMARY OF THE INVENTION

Figure 2:
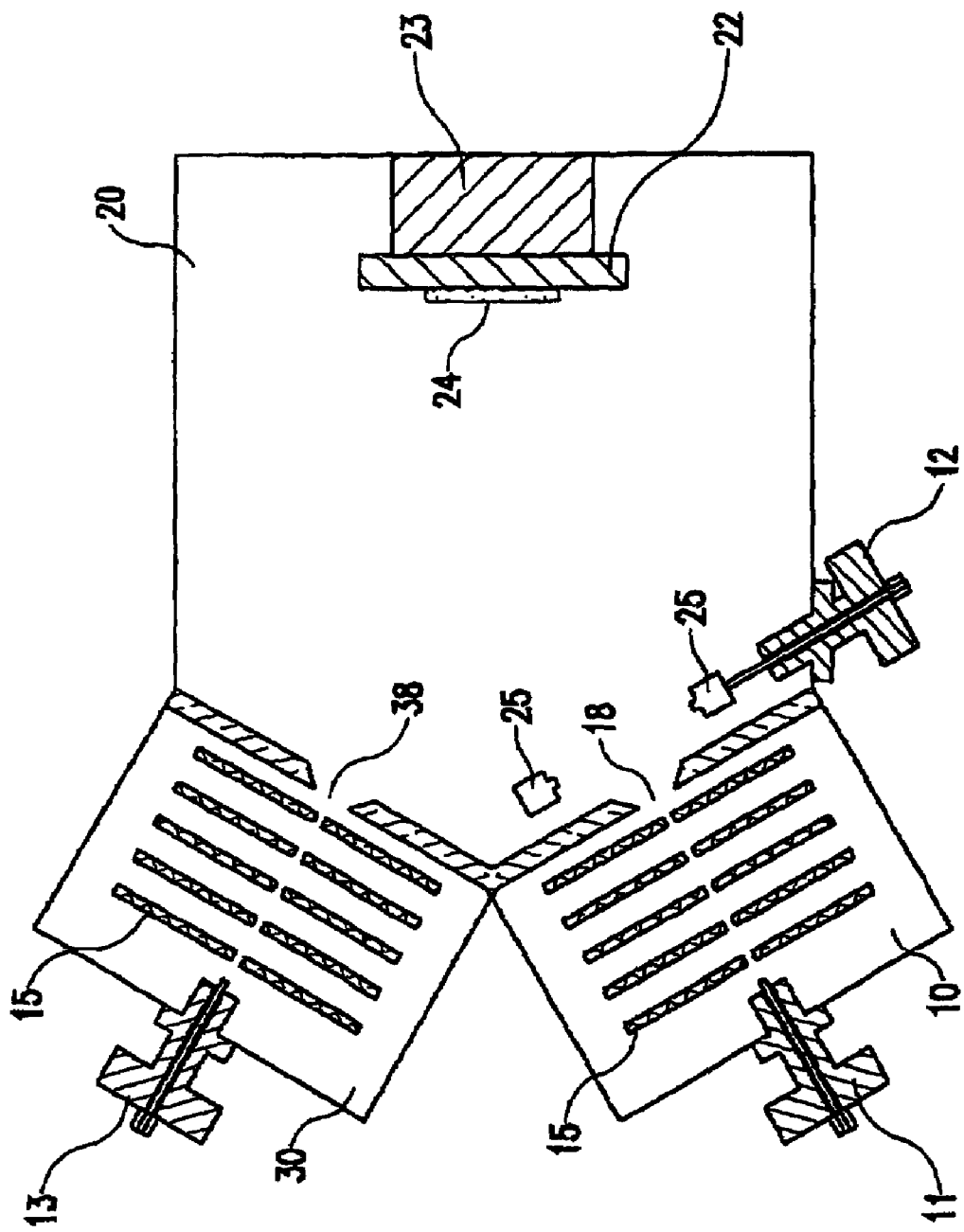

The invention will be further elucidated hereinbelow with reference to a number of embodiments and an associated drawing. In the drawing:

FIG. 1 shows a cross-section of a device for performing a first embodiment of the process according to the invention; and FIG. 2 shows a cross-section of a device for performing a second embodiment of the process according to the invention.

The figures are purely schematic and not drawn to scale. Some dimensions in particular are (highly) exaggerated for the sake of clarity. Corresponding parts are designated as far as possible in the figures with the same reference numerals.

DETAILED DESCRIPTION OF THE INVENTION

FIG. 1 shows a plasma reactor with which an embodiment of the process according to the invention can be carried out. The device essentially comprises two chambers, viz. a plasma chamber 10 and a reaction chamber 20 which are manufactured respectively from copper and stainless steel. In reaction chamber 20 is situated a series of electrodes 15 which are provided in their centre with an opening 16. From a first inlet 11 a suitable carrier fluid such as argon or another noble gas is guided through these openings at a practically constant gas flow of typically about $25.5 \cdot 10^{-3}$ mol/s. A current in the order of 40–50 ampere is carried through this gas, whereby a plasma is created. There will herein finally be a more or less stable potential difference in the order of 200 Volt over the electrodes 15. Electrodes 15 are coupled for this purpose in a resistance bridge (not shown) to stabilize the plasma flow as much as possible. The plasma flows in the direction of the reaction chamber 20 and can enter this via a passage opening 18. The thus generated plasma flow is highly directional when it leaves the plasma chamber as a result of the large gas flow and the high temperature which the injected gas has reached in the plasma.

Owing to the injection of carrier fluid into the plasma chamber 10, an overpressure prevails here relative to reaction chamber 20 during operation, this overpressure being continuously evacuated via a suitable pump connection 21. The plasma generated in plasma chamber 10, which is indicated schematically with a reference numeral 17, will thus be drawn into reaction chamber 20 via passage opening 18 in the wall 19 between plasma chamber 10 and reaction chamber 20, and will there expand. Situated in the reaction chamber is a substrate holder 22 which is connected via a connecting part 23 to the wall of the reaction chamber and which is earthed. Arranged on substrate holder 22 is a substrate 24 which is thus exposed to the incoming plasma arc 17.

In reaction chamber 20 a silicon-containing source fluid is supplied via a second inlet 12 directly behind opening 18. Chosen for the purpose in this embodiment is silane, although good results have also been achieved in practice with disilane and silicon tetrafluoride as source fluid. The source fluid is injected in this embodiment in a quantity of about $1 \cdot 10^{-5}$ mol/s. For a uniform distribution of the source fluid in the reaction chamber it is admitted via a ring structure 25. Ring structure 25 comprises a tubular body which extends around opening 18 and is provided at regular spacing with outlet openings. An homogeneous inflow of the source fluid into the reaction chamber is thus ensured, whereby it comes into contact with plasma 17 in particularly effective manner. In the plasma the silane dissociates into silicon-containing radicals and atomic hydrogen. Once in the vicinity of substrate 24, silicon deposits to form the desired silicon layer on the substrate.

In order to enhance the crystalline structure in the thus deposited silicon layer, in this embodiment an auxiliary fluid is fed according to the invention into the reactor via a third inlet 13. The auxiliary fluid comprises in this embodiment hydrogen gas which has already been admitted into plasma chamber 10 to thus create an argon/hydrogen plasma mixture. In this embodiment a hydrogen flow of about $1 \cdot 10^{-3}$ mol/sec is herein applied.

An excess quantity of hydrogen is thus employed so as to function independently as etching precursor. The atomic hydrogen that is formed ensures that deposited silicon atoms which have herein not bonded in a crystal lattice are selectively etched away so as to then be available once again for deposition. With the process according to the invention an efficiency is thus found to be achievable of more than 50% of the injected source fluid, which implies that more than one in two silicon atoms thus comes to lie in the deposited layer.

A silicon layer having a microcrystalline structure is gradually deposited on substrate 24 in the described manner. X-ray diffraction determinations have shown that the thus formed layer contains silicon crystallites typically in the order of magnitude of 10–100 nm which mutually connect via an amorphous matrix. Owing to the large plasma flux a growth speed of more than 3 nanometres per second can thus be achieved, which for a silicon layer of about 1 μm thickness amounts to a total deposition time of less than 6 minutes. The substrate temperature herein rises no further than about 200–500° C., and under suitable conditions can even be held below 300° C. These temperatures are significantly lower than is required for epitaxial growth techniques and make the process according to the invention suitable, among other things, for deposition on foils of plastic that is not very heat-resistant such as are applied mainly for thin-film solar cells.

An alternative device for performing the process according to the invention is shown in FIG. 2. In this case also the device has separate chambers for the generation of the plasma on the one hand and the final deposition of the silicon layer on the other. Other than in the first embodiment, the plasma chamber in this case takes a dual form. The device therefore comprises a separate plasma chamber 30, with which a plasma of hydrogen or other suitable auxiliary fluid such as for instance fluorine is generated, in addition to a plasma chamber 10 for forming the main plasma of argon or other appropriate carrier fluid, optionally in combination with the auxiliary fluid. Both plasma chambers 10,30 are provided with an inlet 11 respectively 13 for the relevant gas and have a series of electrodes 15 with which the desired plasma can be generated therefrom. Because use is made of separated plasma chambers, these can be operated under optimal conditions for each individual plasma. The electrodes in the plasma chamber are each connected as such into their own resistance bridge adapted to the individual plasma flow, so as to enhance the stability of the process.

Both plasmas enter the reaction chamber 20 via separate openings 18, 38. A silicon-containing source fluid is fed via a third inlet 12 all around the opening 18 between the first plasma chamber 10 and reaction chamber 20 to the plasma which flows into reaction chamber 20 via this opening 18. Silicon-containing radicals are thus formed therefrom which finally deposit in atomic form on the substrate. The plasma which is supplied from the auxiliary fluid and which flows from the second plasma chamber 30 then makes its way directly to the substrate in order to there provide the intended etching precursor which enhances a crystalline deposition.

Situated in the reaction chamber is a substrate holder 22 having thereon a substrate 24 which is thus exposed simultaneously on the one hand to a plasma enriched with silicon radicals and on the other to an etching precursor. In this embodiment silicon tetrafluoride ($SiF_4$) is applied for the silicon-containing source fluid, and the other parameters are retained as according to those of the first embodiment. In this case too, a microcrystalline silicon layer is thus deposited at a deposition speed of more than 3 nm/s at a substrate temperature which can be sustained significantly below 500° C. Here too an efficiency of 50% of the source fluid can once again be achieved.

All in all the invention hereby provides a process for manufacturing a crystalline silicon layer which, owing to the relatively high deposition speed and the relatively high efficiency, is suitable for application on industrial scale, wherein as a result of the relatively low substrate temperature the process can also be applied for substrates of plastic or other material with little heat-resistance.

Although the invention has been elucidated above solely with reference to these two embodiments, it will be apparent that the invention is by no means limited thereto. On the contrary, many more variations and embodiments are possible within the scope of the invention for a person with ordinary skill in the art. A suitable bias voltage can thus be applied between the substrate, via the substrate holder, and the plasma to attract ions from the plasma more to the substrate. This results in a higher ion energy which enhances the density of the obtained structure.

The invention claimed is:

1. Process for depositing an at least partially crystalline silicon layer on a substrate using a plasma, wherein a plasma is generated and the substrate is exposed to a silicon-containing source fluid for deposition of silicon therefrom, characterized in that non-crystalline bonded silicon atoms are preferentially etched, while the partially crystalline silicon layer is deposited, by exposing the substrate concurrently to an auxiliary fluid, and that a pressure drop is applied in a path of both fluids to the substrate.

2. Process as claimed in claim 1, characterized in that the auxiliary fluid is chosen from a group consisting of compounds containing hydrogen, chlorine and fluorine.

3. Process as claimed in claim 2, characterized in that hydrogen gas is applied for the auxiliary fluid.

4. Process as claimed in claim 1, characterized in that a compound from a group consisting of silane, disilane and silicon tetrafluoride is applied for the source fluid.

5. Process as claimed in claim 1, characterized in that a doping fluid is injected containing an element chosen from a group consisting of group III and group V of the periodic system.

6. Process as claimed in claim 1, characterized in that a doping fluid is injected containing carbon.

7. Process as claimed in claim 1, characterized in that an at least substantially inert carrier fluid is also injected and guided to the substrate.

8. Process as claimed in claim 7, characterized in that the carrier fluid is a noble gas.

9. Process as claimed in claim 8, characterized in that argon is applied for the carrier fluid.

10. Process as claimed in claim 7, characterized in that the carrier fluid and the auxiliary fluid are both injected at the location of the plasma and that the source fluid is supplied in a path of the carrier fluid and the auxiliary fluid to the substrate.

11. Process as claimed in claim 1, characterized in that the auxiliary fluid is supplied in at least almost the same flow rate as the source fluid.

12. Process as claimed in claim 11, characterized in that the auxiliary fluid is supplied in a considerably larger flow rate than the source fluid.

13. Process as claimed in claim 1, characterized in that the substrate is accommodated in a reaction chamber, that a plasma arc is generated in a plasma chamber, that an underpressure is created in the reaction chamber relative to the plasma chamber, and that the plasma chamber and reaction chamber are in open communication with each other via a passage opening.

14. Process as claimed in claim 13, characterized in that at least the auxiliary fluid is injected into the plasma chamber and that the source fluid is supplied all around the passage opening in the reaction chamber.

15. Process as claimed in claim 13, characterized in that the reaction chamber is placed via a further passage opening in open communication with a further plasma chamber in which a further plasma arc is generated, and that at least the auxiliary fluid is injected into the first plasma chamber and one or more fluids of a differing composition are fed into the further plasma chamber.

16. Process as claimed in claim 1, characterized in that, a bias voltage is applied between the substrate and the plasma.

17. Device for depositing an at least partially crystalline silicon layer on a substrate using the process of claim 1, comprising a plasma chamber for generating a plasma therein, a reaction chamber provided with a substrate holder which is in open communication with the plasma chamber via a passage opening, and supply means for a silicon containing source fluid, characterized in that the plasma chamber is provided with supply means for an auxiliary fluid for preferentially etching non-crystalline bonded silicon atoms and that pump means are provided for applying a pressure drop between the plasma chamber and the substrate holder at least during operation.

18. Device as claimed in claim 17, characterized in that the supply means for the source fluid debouch in the reaction chamber behind the passage opening and that the supply means for the auxiliary fluid debouch in the plasma chamber in front of the passage opening.

19. Device as claimed in claim 17, characterized in that the reaction chamber is in open communication with a further plasma chamber via a further passage opening and that the further plasma chamber is provided with further supply means for a further fluid or fluid mixture.

20. Device as claimed in claim 19, characterized in that the first plasma chamber provided with the supply means for the auxiliary fluid is placed closer to the substrate holder than the further plasma chamber.

21. Device as claimed in claim 17, characterized in that means are provided for applying an electrical potential difference between the plasma chamber and the substrate holder at least during operation.

22. Device for depositing an at least partially crystalline silicon layer on a substrate, comprising means generating a plasma, means for exposing the substrate to a silicon containing source fluid for deposition of silicon therefrom, means for preferentially etching non-crystalline bonded silicon atoms, while the partially crystalline silicon layer is deposited, by exposing the substrate concurrently to an auxiliary fluid, and means for applying a pressure drop in a path of both fluids to the substrate.

* * * * *